(12) United States Patent
Binhack et al.

(10) Patent No.: US 11,316,439 B2
(45) Date of Patent: Apr. 26, 2022

(54) INVERTER FOR AN ELECTRICAL MACHINE

(71) Applicant: Robert Bosch GmbH, Stuttgart (DE)

(72) Inventors: Stephan Binhack, Knittlingen (DE); Jochen Kurfiss, Lomersheim (DE)

(73) Assignee: Robert Bosch GmbH, Stuttgart (DE)

( * ) Notice: Subject to any disclaimer, the term of this patent is extended or adjusted under 35 U.S.C. 154(b) by 141 days.

(21) Appl. No.: 16/956,437

(22) PCT Filed: Dec. 13, 2018

(86) PCT No.: PCT/EP2018/084741
§ 371 (c)(1),
(2) Date: Jun. 19, 2020

(87) PCT Pub. No.: WO2019/121317
PCT Pub. Date: Jun. 27, 2019

(65) Prior Publication Data
US 2020/0328692 A1    Oct. 15, 2020

(30) Foreign Application Priority Data

Dec. 21, 2017  (DE) .................. 10 2017 223 631.0

(51) Int. Cl.
*H02M 7/00* (2006.01)
*H02M 7/5387* (2007.01)
(Continued)

(52) U.S. Cl.
CPC ....... *H02M 7/003* (2013.01); *H02M 7/53873* (2013.01); *H02P 27/08* (2013.01); *H05K 7/209* (2013.01); *H05K 7/1432* (2013.01)

(58) Field of Classification Search
CPC .. H02M 7/003; H02M 7/53873; H05K 7/209; H05K 7/1432; H02P 27/08
See application file for complete search history.

(56) References Cited

U.S. PATENT DOCUMENTS 6,501,653 B1 * 12/2002 Landsgestell ......... H02M 7/003
                                                              165/185
9,944,312 B2 * 4/2018 Inada ................... B62D 5/0463
(Continued)

FOREIGN PATENT DOCUMENTS

DE          198 17 493 C1     8/1999
DE      10 2007 006 447 A1    8/2007
(Continued)

OTHER PUBLICATIONS

International Search Report corresponding to PCT Application No. PCT/EP2018/084741, dated Mar. 15, 2019 (German and English language document) (6 pages).

*Primary Examiner* — Jue Zhang
(74) *Attorney, Agent, or Firm* — Maginot, Moore & Beck LLP

(57) ABSTRACT

An inverter has at least three phases for supplying current to an electrical machine. The inverter also has a control unit and at least one power output stage connected to the control unit on an input side. The control unit is configured to generate pulse-width-modulated control signals for activating the power output stage. The inverter further has a heat sink and, for each phase, an intermediate circuit capacitor and a semiconductor switch half bridge. The heat sink has a flat thermal contact surface. The thermal contact surface is connected in a thermally conductive manner to the control unit and to the semiconductor switch half bridges. The heat sink has a recess for each of the intermediate circuit capacitors, and the intermediate circuit capacitors are each arranged in one of the recesses in the heat sink.

10 Claims, 2 Drawing Sheets

(51) Int. Cl.
*H02P 27/08* (2006.01)
*H05K 7/20* (2006.01)
*H05K 7/14* (2006.01)

(56) References Cited

U.S. PATENT DOCUMENTS

| | | |
|---|---|---|
| 2005/0040716 A1 | 2/2005 | Schmid et al. |
| 2012/0160596 A1 | 6/2012 | Yamasaki |
| 2019/0334449 A1* | 10/2019 | Iwagami .............. H05K 7/1432 |

FOREIGN PATENT DOCUMENTS

| | | |
|---|---|---|
| DE | 11 2010 002 719 T5 | 6/2012 |
| DE | 10 2011 081 283 A1 | 2/2013 |
| DE | 10 2015 219 476 A1 | 12/2016 |
| EP | 2 190 015 A1 | 5/2010 |
| EP | 3 109 979 A1 | 12/2016 |
| JP | H11-225485 A | 8/1999 |
| JP | 2004-201462 A | 7/2004 |
| JP | 2016-226096 A | 12/2016 |

\* cited by examiner

INVERTER FOR AN ELECTRICAL MACHINE

This application is a 35 U.S.C. § 371 National Stage Application of PCT/EP2018/084741, filed on Dec. 13, 2018, which claims the benefit of priority to Serial No. DE 10 2017 223 631.0, filed on Dec. 21, 2017 in Germany, the disclosures of which are incorporated herein by reference in their entirety.

BACKGROND

The disclosure relates to an inverter. The inverter has at least three phases for energizing an electrical machine. The inverter also has a control unit and at least one power output stage connected at input to the control unit. The control unit is designed to generate in particular pulse width-modulated control signals in order to drive the power output stage. The power output stage is preferably designed to energize the electrical machine depending on the control signal.

DE11 2010 002 719 T5 discloses a drive device in which an electronic control unit has semiconductor modules and capacitors that are arranged in the axial direction of a motor.

SUMMARY

According to the disclosure, the inverter has a heat sink, and an intermediate circuit capacitor and a semiconductor switch half bridge for each phase. The heat sink has a thermal contact surface with an in particular flat design. The thermal contact surface is thermally conductively connected to the control unit and to the semiconductor switch half bridges. The heat sink has a respective recess for the intermediate circuit capacitors, wherein the intermediate circuit capacitors are each arranged in a recess in the heat sink. The intermediate circuit capacitors each have a ground terminal, wherein the ground terminal is electrically connected to the heat sink. The semiconductor switch half bridges each have a ground terminal and are electrically connected to the heat sink by way of the ground terminal. Preferably, an intermediate circuit capacitor, assigned to a phase, and a semiconductor switch half bridge, which is assigned to the same phase, are preferably arranged jointly on a radial connection to the control unit. It is thereby advantageously possible to form a star-shaped arrangement of the components of the inverter, wherein the control unit is arranged in the center of the star-shaped arrangement. A low-inductance inverter may thus advantageously be formed. The current paths on the ground line may advantageously be designed to be as short as possible, in so far as the heat sink forms an electrical connection line between the power output stages and the intermediate circuit capacitors for the ground potential. Compensation currents flowing between mutually different intermediate circuit capacitors when the phases are switched are thus advantageously also able to flow back and forth between the intermediate circuit capacitors with particularly low inductance and low losses.

In one preferred embodiment, the intermediate circuit capacitors are each designed to be cylindrical. A central axis, in particular longitudinal axis, of the intermediate circuit capacitors preferably runs in each case transverse to a flat extent of the thermally conductive surface. An electrical terminal of the intermediate circuit capacitor, in particular a positive terminal of the intermediate circuit capacitor, is preferably operationally connected to the power output stage, in particular a semiconductor switch half bridge. The electrical terminal of the intermediate circuit capacitor is thus connected to a positive supply voltage of the semiconductor switch half bridge. A capacitor can of the intermediate circuit capacitor, in particular a ground terminal of the intermediate circuit capacitor, is preferably electrically connected to the heat sink. The intermediate circuit capacitor is thereby able to be connected to the heat sink with low inductance. Ground currents are thus advantageously able to flow from or to the intermediate circuit capacitor, preferably in all directions radially around the intermediate circuit capacitor, such that it is possible to form a current path that is as short as possible in the heat sink, depending on the connection partner to the intermediate circuit capacitor.

The intermediate circuit capacitor is preferably a wound capacitor, wherein a winding axis forms the central axis. The intermediate circuit capacitor is preferably an electrolytic capacitor or a supercapacitor.

The intermediate circuit capacitor may for example be screwed into the recess. To this end, the intermediate circuit capacitor may have a thread on an outer surface of the housing can and the heat sink may have a corresponding mating thread in the receptacle. The intermediate circuit capacitor is thereby able both to be electrically connected well and to be thermally conductively connected well to the heat sink.

In another embodiment, the intermediate circuit capacitor may be connected to the heat sink by way of an electrically conductive spring element. In another advantageous embodiment, the intermediate circuit capacitor may be adhesively bonded into the recess by way of an electrically conductive thermally conductive adhesive. It is thus advantageously possible to form a low-resistance connection, in particular full-surface low-resistance connection, between the housing can and the heat sink, in which an outer surface of the housing can is in full electrical operational contact with the heat sink in the recess.

The above-described embodiments of the electrical connection of the intermediate circuit capacitor to the heat sink by way of a contact spring or by way of a thermally conductive adhesive are described in DE10 2011 081 283 A1 filed by the applicant.

In one preferred embodiment, the capacitor can is welded, in particular laser-welded or electrowelded, to the heat sink by way of an in particular circumferential weld connection. The intermediate circuit capacitor is thus able to be accommodated with particularly little effort in an aperture in the heat sink, which is designed for example as a cooling plate, in particular aluminum plate, that extends flat. After the intermediate circuit capacitor has been inserted, in particular pressed into or laid into the recess in the heat sink, the capacitor can is able to be welded—for example by way of a weld seam or weld spots—on a can bottom in particularly annularly to the heat sink. The capacitor can of the intermediate circuit capacitor is thus advantageously connected to the heat sink with a small electrical resistance and a small heat transfer resistance.

In another embodiment, the intermediate circuit capacitor may have a capacitor winding, wherein the capacitor winding is arranged in the recess, such that the recess in the heat sink forms a capacitor can of the intermediate circuit capacitor, preferably electrolytic capacitor or supercapacitor. An electrolyte of the intermediate circuit capacitor is preferably in direct contact with the heat sink, in particular an inner wall of the heat sink, in the recess. The intermediate circuit capacitor is thereby advantageously able to be connected to the heat sink with a heat transfer resistance that is as low as possible and an electrical transfer resistance that is as low as possible, and embedded in the heat sink.

In one preferred embodiment, the electrical connections between the semiconductor switch half bridge and the intermediate circuit capacitor run in a wiring plane that extends parallel to the thermal contact surface. More preferably, the electrical connections run close to the heat sink, such that electromagnetic fields of a current that flows from the semiconductor switch half bridge to the intermediate circuit capacitor and a current that flows from the intermediate circuit capacitor in the heat sink to the power output stage electromagnetically compensate one another. Advantageously, the inverter may thus generate particularly little EMC radiation (EMC=electromagnetic compatibility). More advantageously, the inverter, in particular a switching cell, comprising a semiconductor switch half bridge and an intermediate circuit capacitor for a phase, may thus be designed with low inductance.

In one preferred embodiment, the electrical connections, in particular the signal paths that extend between the control unit and the power stages, run in the wiring plane. It is thereby advantageously possible to form a distance from the heat sink that is as short as possible, which results in little EMC radiation emanating from the connection lines.

In one preferred embodiment, an in particular positive current conduction path of a phase runs from the semiconductor switch half bridge to the intermediate circuit capacitor, and/or in the wiring plane on a radial connection to the control unit. A current path that is as short as possible is thereby advantageously able to be formed between the semiconductor switch half bridge and the intermediate circuit capacitor.

In one preferred embodiment, an in particular positive signal path of a phase runs from the control unit to the semiconductor switch half bridge in the wiring plane and/or on the radial connection to the control unit. A signal path that is as short as possible is thereby able to be formed from the control unit to the semiconductor switch half bridge. More advantageously, control signals of mutually different phases are able to influence one another as little as possible due to separation thus formed spatially by way of the star-shaped arrangement. Crosstalk between signals, which may lead to incorrect switching operations, is thus effectively attenuated or prevented.

In one preferred embodiment of the inverter, a star-shaped connection arrangement is formed by way of the control unit and the radial connections to the semiconductor switch half bridges, wherein a ground terminal of the control unit is arranged in a center or in the region of the center of the connection arrangement. The control unit is preferably connected to the heat sink by the ground terminal. A particularly low-inductance connection arrangement is thereby also able to be formed from the control unit to the semiconductor switch half bridges.

The heat sink preferably forms a ground connection, in particular a ground line, between the control unit and the semiconductor switch half bridges, and more preferably the intermediate circuit capacitors, such that the ground currents are able to flow through the heat sink. Ground currents may for example be a ground current between a semiconductor switch half bridge and an intermediate circuit capacitor or a ground current between the control unit and a semiconductor switch half bridge or between the control unit and an intermediate circuit capacitor.

In one preferred embodiment, the heat sink has a cooling plate, wherein cooling cans for receiving the electrolytic capacitors are attached to the cooling plate. The heat sink is for example an aluminum heat sink that is produced for example by milling from an aluminum block or by way of aluminum casting. The heat sink may thus advantageously—in comparison with an in particular cylindrical mass block—be formed in a material-saving manner, such that the intermediate circuit capacitors are each arranged with a longitudinal section in the cooling plate and a remaining longitudinal section of the intermediate circuit capacitors, in particular of a capacitor can of the intermediate circuit capacitor, is arranged in the cooling can.

In one preferred embodiment, the central axes of the intermediate circuit capacitors, preferably a winding axis of the capacitor windings of the intermediate circuit capacitors, each extend transverse to the wiring plane. The inverter is thus advantageously able to be designed in a space-saving manner.

In another embodiment, the central axes of the intermediate circuit capacitors, preferably the winding axis of the capacitor windings of the intermediate circuit capacitors, each extend parallel to the wiring plane and also parallel to the thermally conductive surface. The heat sink may thus advantageously have a small thickness extent, in particular in the case of intermediate circuit capacitors that have a greater longitudinal extent along the central axis than a diameter of the intermediate circuit capacitor.

The semiconductor switch half bridges are in each case preferably arranged on a circuit carrier, in particular a ceramic circuit carrier, and connected to the circuit carrier. The circuit carrier is for example a ceramic circuit carrier, in particular a DBC circuit carrier (DBC=direct bonded copper), an AMB circuit carrier (AMB=active metal brazed) or an LTCC circuit carrier (LTCC=low-temperature cofired ceramics) or an HTCC circuit carrier (HTCC=high-temperature cofired ceramics).

The connection lines between the semiconductor switch half bridge and the intermediate circuit capacitors, in particular the positive terminals of the intermediate circuit capacitors, may advantageously run in the wiring plane without an overlap. Preferably, all of the connection lines between the semiconductor switch half bridges and the intermediate circuit capacitors and the control unit run in the wiring plane without an overlap with respect to one another. The connection lines between the semiconductor switch half bridges and the intermediate circuit capacitors and the control unit are in each case preferably formed by a bonded wire connection or a bonded strip connection.

The inverter has for example at least three phases or only three phases, at least four phases or only four phases, at least five phases or only five phases, or at least six phases or only six phases, or more than six phases.

The disclosure also relates to an electrical machine, in particular an electric motor and/or generator, having an inverter of the kind described above. The machine has a stator with stator coils and a rotor of in particular permanent magnetic design. The electrical machine may be part of a power steering system or of an electric drive for an electric vehicle or hybrid vehicle.

BRIEF DESCRIPTION OF THE DRAWINGS

The disclosure is now described below with reference to figures and further exemplary embodiments. Further advantageous variant embodiments become apparent by combining the features described in the figures and in the dependent claims.

DETAILED DESCRIPTION

Figure 1:
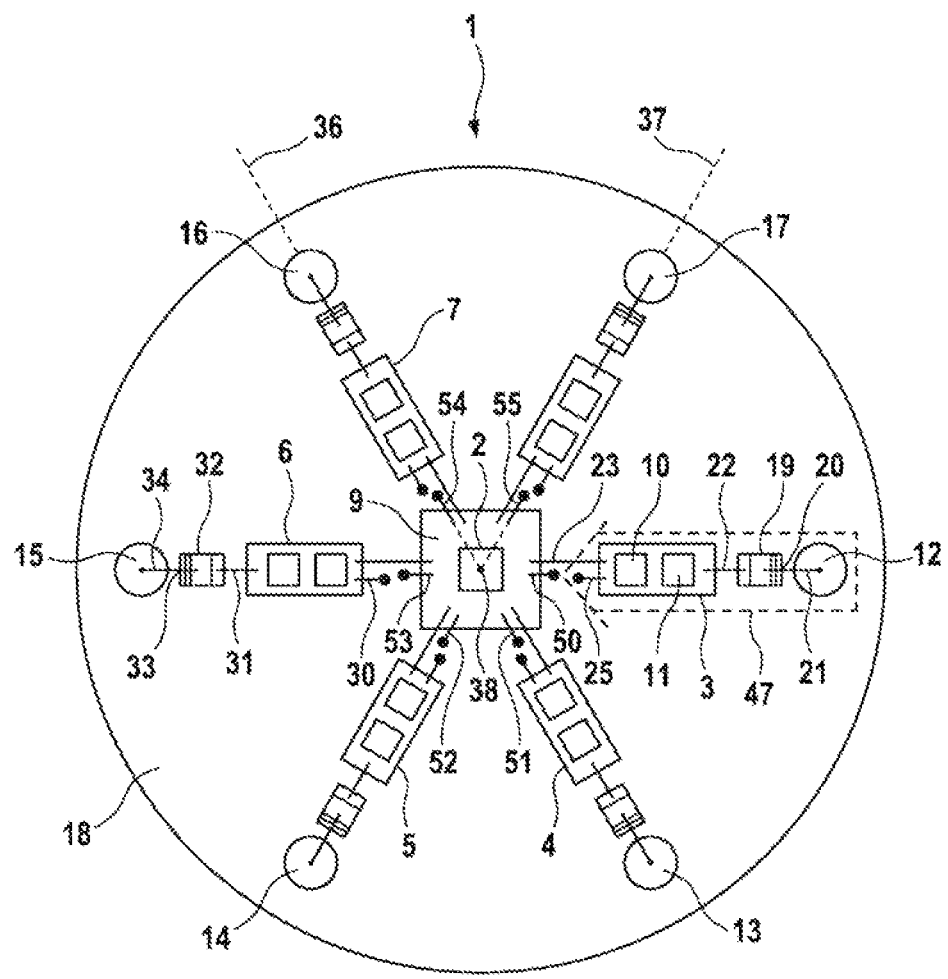
FIG. 1 shows an exemplary embodiment of an inverter that has a six-phase design and is designed to energize six stator coils of an electrical machine.

FIG. 1 schematically shows an exemplary embodiment of an inverter 1 in a top view. The inverter 1 has a control unit 2. The control unit 2 has for example a microprocessor, a microcontroller, an ASIC (ASIC=application-specific integrated circuit) or an FPGA (FPGA=field-programmable gate array) and is designed to generate in particular pulse width-modulated control signals in order to drive a power output stage. The inverter 1 in this exemplary embodiment has a six-phase design and has a semiconductor switch half bridge and an intermediate circuit capacitor for each phase. The inverter 1 for this purpose has a semiconductor switch half bridge 3, a semiconductor switch half bridge 4, a semiconductor switch half bridge 5, a semiconductor switch half bridge 6, a semiconductor switch half bridge 7 and a semiconductor switch half bridge 8. The semiconductor switch half bridges 3, 4, 5, 6, 7 and 8 together form a power output stage of the inverter 1. The semiconductor switch half bridges 3, 4, 5, 6, 7 and 8 are in each case connected to a control unit 2 by way of at least one electrical connection line or a plurality of electrical connection lines, in particular a bonded wire connection or bonded strip connection, and may in each case receive a control signal from the control unit via the electrical connection in order to drive the semiconductor switch half bridge, in particular from control terminals of the half bridge. The semiconductor switch half bridges may energize a stator, in particular stator coils of an electrical machine, not illustrated in FIG. 1, depending on the control signal. The control unit 2 is designed to generate an in particular pulse width-modulated drive signal in order to indirectly generate a rotary magnetic field and to transmit it to the semiconductor switch half bridges. The control signal represents for example a sinusoidal signal.

The semiconductor switch half bridge 3 has a high-side semiconductor switch 10 and a low-side semiconductor switch 11. The semiconductor switches 10 and 11 are formed for example by a field-effect transistor, in particular a MOSFET, or MISFET (MIS=metal-insulated transistor), or an IGBT (IGBT=insulated gate bipolar transistor), or an HEMT transistor (HEMT=high electron mobility transistor). The semiconductor switch half bridge 3 is connected at output to a leadframe 19 via an electrical connection 22. The leadframe 19, in particular a punched copper part, has a wire receptacle 20, in particular an insulation displacement connection or clamps, wherein the wire receptacle 20 is designed to be connected, in particular cold-welded or laser-welded, to an electrical terminal 21, in particular a terminal wire, of an intermediate circuit capacitor 12. The semiconductor switch half bridge 3 is connected at output to the leadframe 19 by way of a bonded wire connection 22, in particular bonded strip connection.

The inverter 1 also has a respective intermediate circuit capacitor for the other phases. To this end, an intermediate circuit capacitor 13 is connected to the semiconductor switch half bridge 4, an intermediate circuit capacitor 14 is connected to the semiconductor switch half bridge 5, an intermediate circuit capacitor 15 is connected to the semiconductor switch half bridge 6, and an intermediate circuit capacitor 16 is connected to a semiconductor switch half bridge 7 and an intermediate circuit capacitor 17 is connected to a semiconductor switch half bridge 8. The semiconductor switch half bridges and the intermediate circuit capacitors connected in each case to the semiconductor switch half bridges are each arranged on a radial straight line starting from a center 38 and extending radially outwardly from the center, hereinafter also called radial. A radial 36 that extends starting from the center 38 is shown by way of example, wherein the intermediate circuit capacitor 16 and the semiconductor switch half bridge 7 are arranged on the radial 36. The intermediate circuit capacitor and the semiconductor switch half bridge 8 extend on a radial 37 that extends adjacent to the radial 36, running in the circumferential direction around the center 38. The ground current paths in the heat sink 18 are designed to be short enough that a switching cell, comprising a semiconductor switch half bridge and an intermediate circuit capacitor for one phase, has a low-inductance design. The radials 36 and 37 thus enclose an angle between one another and extend in a wiring plane 40, shown in more detail in FIG. 2, in this exemplary embodiment. The radials 36 and 37 that are arranged adjacent to one another thus for example enclose an angle of 60 degrees between one another.

The semiconductor switch half bridges are each connected to the control unit 2 by way of an electrical connection line and are able to receive the control signals, generated by the control unit 2, via the connection line. An electrical connection line 23 that connects the control unit 2 to the semiconductor switch half bridge 3 is shown by way of example.

The inverter 1 also has a heat sink 18. The semiconductor switch half bridges 3, 4, 5, 6, 7 and 8 are each electrically connected to the heat sink 18 by way of an electrical connection, in particular a bonded wire connection or bonded strip connection. A ground connection 25, formed by a bonded strip connection 25, which connects the semiconductor switch half bridge 3 to the heat sink 18, and a bonded strip connection 30 that connects the semiconductor switch half bridge 6 to the heat sink 18 is shown by way of example. In this exemplary embodiment, the semiconductor switch half bridges are electrically connected to the heat sink 18 in each case by the low-side semiconductor switch, in particular a source terminal of the low-side semiconductor switch of the half bridge. In this exemplary embodiment, the electrical connection to the heat sink 18 is arranged in the region of a radial and points toward the control unit 2. A current path 47, illustrated as a dashed arrow in FIG. 1, from the intermediate circuit capacitor 12 to the semiconductor switch half bridge 3, which forms in the heat sink 18 on the shortest path from the intermediate circuit capacitor 12 to the ground connection 25, may thus lie opposite a positive power path from the semiconductor switch half bridge 3 to the intermediate circuit capacitor 12. It is thereby possible to form a low-inductance and low-loss switching cell. The control unit 2 is electrically connected to the heat sink 18 by way of at least one electrical ground connection, for example a bonded wire or a bonded strip connection. In this exemplary embodiment, a ground connection 50, 51, 52, 53, 54 and 55, situated on the respective radial, is formed for each phase, such that no crosstalk is able to take place between individual connection lines, each carrying a control signal, from the control unit 2 to the semiconductor switch half bridges. The electrical connection 24 is for example a bonded wire connection. The heat sink 18 thus forms a common ground connection, and in this exemplary embodiment also a mounting platform for the components of the inverter 1 that are connected to the heat sink 18. The intermediate circuit capacitors 12, 13, 14, 15, 16 and 17 each have a housing can, wherein the housing can forms a negative electrical terminal of the intermediate circuit capacitors that is electrically connected to the heat sink 18. The electrical connection is for example a weld connection and is illustrated in more detail in FIG. 2 below.

Figure 2:
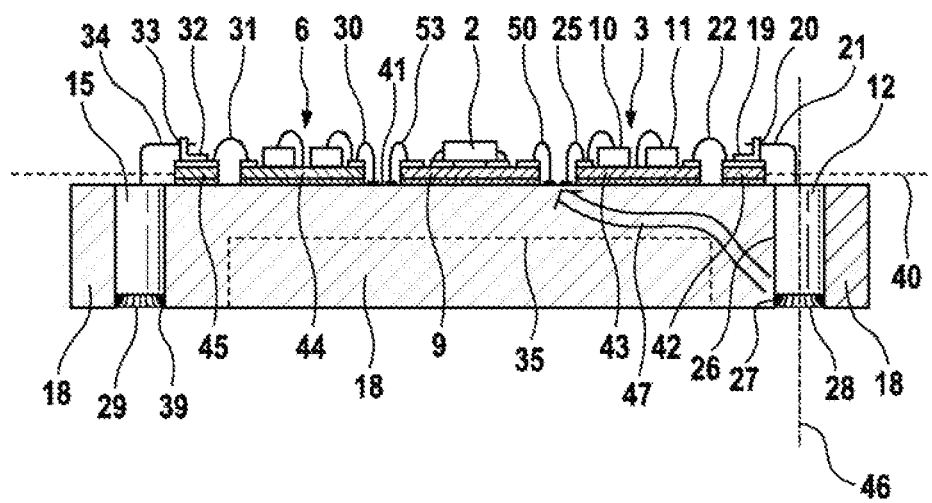
FIG. 2 shows the inverter, illustrated in FIG. 1, in a sectional illustration, wherein the heat sink forms a ground potential used jointly by electronic components of the inverter.

FIG. 2 schematically shows the inverter 1 illustrated in FIG. 1 in a sectional illustration. The heat sink 18, which is formed in this exemplary embodiment by a mass metal plate, in particular aluminum plate or copper plate, has a respective recess for the intermediate circuit capacitors 12 and 15. The intermediate circuit capacitor 12 is received in a recess 28 in the heat sink 18 and the intermediate circuit capacitor 15 is received in a recess 29 in the heat sink 18. The intermediate circuit capacitor 12 has a housing can 26, which forms a negative terminal of the intermediate circuit capacitor 12 in this exemplary embodiment. The housing can 26 is thermally conductively connected to the heat sink 18 by an inner wall of the recess 28 in the heat sink 18. The intermediate circuit capacitor 12 may for this purpose for example be pressed into the recess 28 and thus make at least partial or complete circumferential touching contact with the heat sink 18 by way of its outer surface of the housing can 26. In this exemplary embodiment, the housing can 26 is welded to the heat sink 18 in the region of a can bottom by way of a weld connection 27, in particular a weld seam or weld bead. The intermediate circuit capacitor 12 is thus materially electrically and mechanically connected to the heat sink 18. The intermediate circuit capacitor 15 is friction-welded to the heat sink 18 in the region of a can bottom of the intermediate circuit capacitor 15 by way of a weld connection 39.

In one variant, the heat sink 18 may have a recess 35, which is illustrated in dashed form in FIG. 2. The recess 35 extends between the intermediate circuit capacitors 12 and 15, which are each arranged along one radial of two radials running coaxially with respect to one another. The heat sink thus forms a cooling plate to which a cooling can or cooling hollow cylinder is in each case attached in order to receive the intermediate circuit capacitors 12 and 15.

In this exemplary embodiment, the heat sink 18 also has a thermal contact surface 41, in particular extending flat, wherein the electrical components of the inverter 1, as already described in FIG. 1, are thermally conductively connected to the thermal contact surface 41.

In this exemplary embodiment, the control unit 2 is connected to a circuit carrier 9. The circuit carrier 9 is formed for example as a DBC substrate or LTCC substrate. The control unit 2 is connected at output to the semiconductor switch half bridge 3 by way of the connection line 23. The semiconductor switch half bridge 3 is connected to a circuit carrier 42 by way of a bonded wire connection 22, on which circuit carrier the leadframe 19 with the wire receptacle 20, in particular insulation displacement connection or clamps, is arranged. The leadframe 19 is soldered to the circuit carrier 42. The positive terminal of the intermediate circuit capacitor 12, formed by the terminal wire 21, is electrically connected to the wire receptacle 20, such that the intermediate circuit capacitor 12 is connected to the semiconductor switch half bridge 3 by its positive terminal via the wire receptacle 20, the leadframe 19, the circuit carrier 42 and the bonded wire connection 22. In another embodiment, the connection wire 21 may be welded to the leadframe.

The intermediate circuit capacitor 15 has a positive terminal that is formed by a connection wire 34. The connection wire 34 is electrically connected to a leadframe 32 by way of the leadframe 32 and a wire receptacle 33 attached to the leadframe 32. The connection wire 34 may be welded to the wire receptacle 20. The leadframe 32 is electrically connected to the semiconductor switch half bridge 6 by way of a bonded wire connection 31. The intermediate circuit capacitor 15 is thus electrically connected to the phase that is formed by the semiconductor switch half bridge 6.

In this exemplary embodiment, the semiconductor switch half bridge 3 comprises a circuit carrier 43, which is formed for example by a ceramic circuit carrier, in particular a DBC substrate or LTCC substrate. The semiconductor switches 10 and 11 are electrically connected, for example soldered, to the circuit carrier 43. The semiconductor switch half bridge 6 comprises a circuit carrier 44 to which the semiconductor switch half bridge 6 is connected. The leadframe 32 is connected to the heat sink 18 by way of a circuit carrier 45 soldered to the leadframe 32. The circuit carriers 9, 42, 43, 44 and 45 are in each case thermally conductively connected to the thermal contact surface 41 and may for this purpose in each case be thermally conductively connected to the thermal contact surface 41, and thus to the heat sink 18, by way of a thermally conductive adhesive. Waste heat generated by the semiconductor switch half bridges 3 and 6, and also by the control unit 2, may thus be dissipated to the heat sink 18. The waste heat generated by the intermediate circuit capacitors 12 and 15 may be output via the weld connection 27 or the weld connection 39 from the housing can to the heat sink 18, or additionally via the touching contact between the housing can of the respective intermediate circuit capacitor and the inner wall of the recess in the heat sink 18. The circuit carriers 42, 43, 9, 44 and 45 are each arranged in a wiring plane 40 that extends parallel to the thermal contact surface 41. A central axis 46 of the intermediate circuit capacitor 12 extends transverse to the wiring plane and thus also transverse to the thermal contact surface 41. The electromagnetic fields that are generated by the connection lines, in particular the bonded connections 22, 23, 30 and 31, are thus able, with the respective opposing currents flowing in the heat sink 18, for example the current 47, to compensate the respectively generated electromagnetic fields with respect to one another. The current 47—in particular ground current—in the heat sink 18 may also flow to the ground terminal 50 of the control unit 2, wherein the ground terminal 50 connects the control unit 2 to the heat sink 18.

The invention claimed is:

1. An inverter comprising:
   at least three phases configured to energize an electrical machine;
   a control unit;
   at least one power output stage connected at an input to the control unit and having a plurality of semiconductor switch half bridges, wherein the control unit is configured to generate pulse width-modulated control signals in order to drive the at least one power output stage, and wherein the at least one power output stage is configured to energize the electrical machine depending on the control signals,
   a heat sink; and
   a plurality of intermediate circuit capacitors,
   wherein the plurality of semiconductor switch half bridges includes a corresponding semiconductor switch half bridge for each phase of the at least three phases,
   wherein the heat sink has a flat thermal contact surface,
   wherein the thermal contact surface is thermally conductively connected to the control unit and to the plurality of semiconductor switch half bridges, wherein the heat sink has a respective recess for each of the intermediate circuit capacitors and the intermediate circuit capacitors are each arranged in a recess in the heat sink, wherein ground terminals of the intermediate circuit capacitors and of the semiconductor switch half bridges are each connected to the heat sink, and wherein (i) a corresponding intermediate circuit capacitor assigned to a corresponding phase of the at least three phases, and (ii) a semiconductor switch half bridge are arranged jointly on a radial connection to the control unit.

2. The inverter as claimed in claim 1, wherein:
the intermediate circuit capacitors are each configured to be cylindrical,
a central axis of the intermediate circuit capacitors runs in each case transverse to a flat extent of the thermal contact surface, and
a corresponding capacitor can of each of the intermediate circuit capacitors is electrically connected to the heat sink.

3. The inverter as claimed in claim 2, wherein the central axes of the intermediate circuit capacitors each extend transverse to the wiring plane.

4. The inverter as claimed in claim 1, wherein electrical connections between the semiconductor switch half bridges and the intermediate circuit capacitors run in a wiring plane that extends parallel to the thermal contact surface.

5. The inverter as claimed in claim 4, wherein a positive current conduction path of a phase of the at least three phases runs from the semiconductor switch half bridges to the intermediate circuit capacitors, and/or in the wiring plane on the radial connection to the control unit.

6. The inverter as claimed in claim 4, wherein a positive signal path of a phase of the at least three phases runs from the control unit to the semiconductor switch half bridges in the wiring plane and/or on the radial connection to the semiconductor switch half bridges.

7. The inverter as claimed in claim 1, wherein each intermediate circuit capacitor has a capacitor winding that is arranged in the recess, such that the recess forms a capacitor can for each of the intermediate circuit capacitors.

8. The inverter as claimed in claim 1, wherein:
the control unit and the radial connections to the semiconductor switch half bridges form a star-shaped connection arrangement, and
a ground terminal of the control unit is arranged in a region of a center of the connection arrangement.

9. The inverter as claimed in claim 1, wherein the heat sink forms a ground connection between the control unit and the semiconductor switch half bridges and the intermediate circuit capacitors, such that ground currents are able to flow through the heat sink.

10. The inverter as claimed in claim 1, wherein:
the heat sink has a cooling plate, and
cooling cans or cooling cylinders for receiving the intermediate circuit capacitors are attached to the cooling plate.

* * * * *